May 17, 1955 T. T. N. BUCHER 2,708,739

OSCILLATOR FREQUENCY CONTROL

Filed Feb. 12, 1952

INVENTOR
Thomas T. N. Bucher
BY
Charles H. Brown
ATTORNEY

United States Patent Office 2,708,739
Patented May 17, 1955

2,708,739

OSCILLATOR FREQUENCY CONTROL

Thomas T. N. Bucher, Moorestown, N. J., assignor to Radio Corporation of America, a corporation of Delaware Application February 12, 1952, Serial No. 271,221

7 Claims. (Cl. 332—29)

This invention relates to the frequency control of oscillators, and more particularly to a circuit arrangement whereby automatic frequency control or frequency modulation of an oscillator can be effected.

On object of this invention is to provide a simple, novel arrangement by means of which oscillator frequency deviations larger than those usually obtainable can be achieved.

Another object is to devise a novel oscillator frequency control circuit utilizing diodes as the variable impedance elements for frequency control purposes.

A further object is to devise a novel frequency modulation circuit utilizing two diodes so connected as to reduce substantially the production of even harmonics in the modulator circuit.

The objects of this invention are accomplished, briefly, in the following manner:

A pair of non-linear resistances or resistance devices, which for example may be either crystal diodes or vacuum tube diode structures, are connected in such a way that low frequency (or D. C.) control current is fed through them in series and a high frequency current or carrier frequency is fed to them in parallel through a fixed reactance, such as a capacitor, from the tank circuit of an oscillator. By varying the control current, the effective resistance of the non-linear resistances is varied, thus providing a variable susceptance across the oscillator tank circuit and varying the frequency of the oscillator. The low frequency control current may conveniently be varied by means of an electron discharge device.

The invention will be best understood from the following description of an exemplification thereof, reference being had to the accompanying drawings, wherein.

Figure 4:
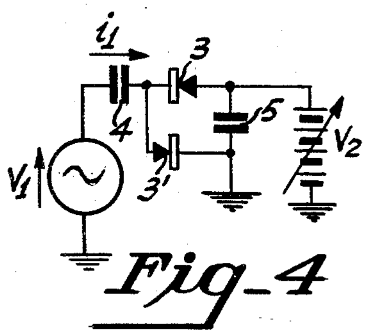
Fig. 4 illustrates one embodiment of a diode-type variable resistance circuit of the invention.
Figure 7:
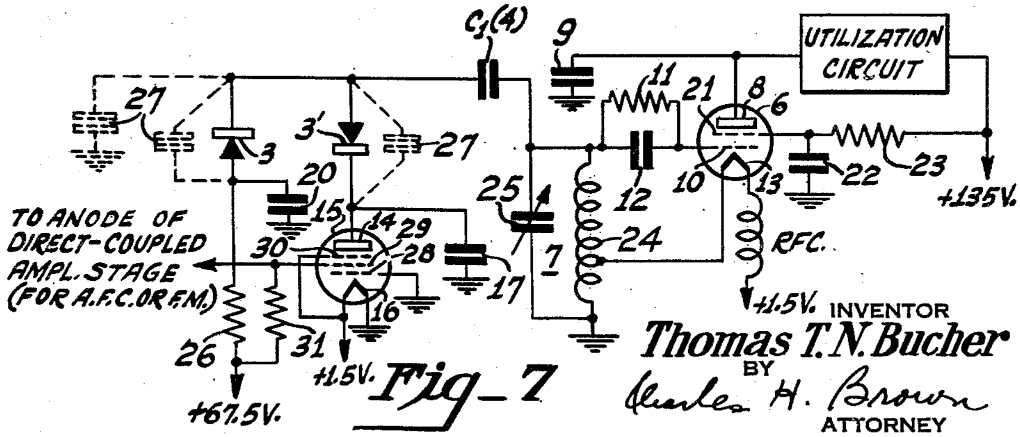

Figs. *6a*, *6b* and *6c* are various waveforms useful in explaining the operation of the Fig. 4 circuit; and Fig. 7 is a detailed circuit diagram of a practical circuit of the invention utilizing the double-diode principle of Fig. 4, for oscillator frequency control.

Figure 1:
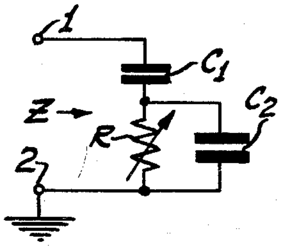
Fig. 1 is a basic type of variable susceptance circuit illustrated herein to explain the principle of operation of this invention.
Figure 2:
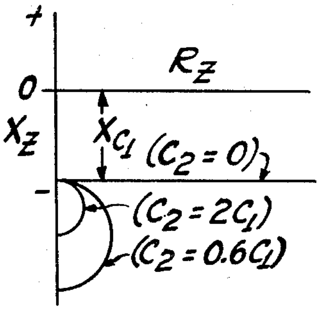
Figs. 2 and 3 are sets of curves useful in explaining the operation of the Fig. 1 circuit.
Figure 3:
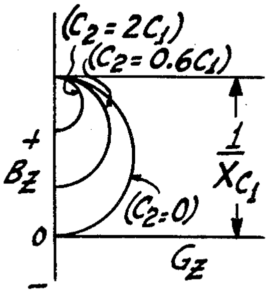

The explanation of the invention will begin with the aid of Figs. 1–3. Referring to Fig. 1, a resistance R which can be varied is connected in series with a fixed reactance such as a capacitor $C_1$ to provide a variable susceptance, in a manner to be described hereinafter, between terminals 1 and 2, terminal 2 being grounded. A capacitor $C_2$ is connected in shunt with resistor R.

Fig. 2 is a plot of the impedance of the Fig. 1 network as the resistance R is varied from zero to infinity, the resistive component $R_z$ lying along the horizontal axis and the reactive component $X_z$ along the vertical axis.

In Fig. 2, three curves are illustrated, the first (a straight horizontal line) being for a zero value of $C_2$ and the others (curved lines) being for two increased values of $C_2$, as indicated by the legends. Some value of $C_2$ (greater than zero) is unavoidable and, depending upon the particular circumstances, a larger value than the unavoidable minimum may be desirable, to limit the range of impedance variation.

Fig. 3 is a plot of the admittance for the same cases, as the resistance R is varied from zero to infinity, the conductance component $G_z$ lying along the horizontal axis and the susceptance component $B_z$ along the vertical axis. It will be noted from this figure that, for any particular value of capacitance $C_2$, there is a susceptance variation accompanied by an unavoidable variation in conductance, as the resistance R is varied.

If the terminals 1 and 2 of the circuit of Fig. 1 are connected across a tuned or resonant circuit the tuning of the circuit may be caused to vary in response to the susceptance variation, the Q of the circuit being incidentally varied. If the tuned circuit is controlling an oscillator, the frequency of such oscillator may be made to vary by varying the resistance of resistor R. This is the idea upon which the frequency control arrangement of this invention is based, that is, the variation of resistance of R to provide a susceptance variation and a consequent variation in tuning of a tuned circuit coupled to the variable-susceptance circuit.

Fig. 4 shows a circuit arrangement employing two non-linear resistances or resistance devices 3 and 3', for example crystal diodes or vacuum tube diode structures. Two opposite electrodes of diodes 3 and 3' are connected together and through a capacitor 4 to one terminal of the source of RF voltage $V_1$ the opposite terminal of which is grounded, while the remaining electrode of diode 3 is connected to one terminal of a low frequency source $V_2$ the opposite terminal of which is grounded. The remaining electrode of diode 3' is grounded, while to complete the circuit a capacitor 5 is connected from that electrode of diode 3 nearest source $V_2$, to ground. Capacitor 5 has low impedance at the frequency of source $V_1$ but high impedance at the frequency (represented as zero frequency in this figure) of source $V_2$. By means of the above-described connections, the low frequency or zero frequency current derived from voltage source $V_2$ is fed through the two diodes 3 and 3' in series since capacitor 5 has high impedance at the frequency of source $V_2$ and since the diodes have their directions of conduction in the same sense for this series circuit. The high frequency or RF is applied to the junction or common connection of these diodes so that in effect they are connected in parallel and oppositely-poled for the high frequency alternating current, since capacitor 5 has low impedance at the frequency of source $V_1$. Diode 3' conducts on the positive swing or positive half-cycle of the high frequency voltage $V_1$, while diode 3 conducts on the negative swing or negative half-cycle of this high frequency voltage.

Figure 5:
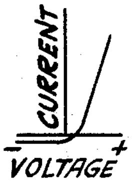
Fig. 5 is a curve illustrating the non-linear resistance characteristic of each of the diodes of Fig. 4.

Fig. 5 is a typical voltage-current characteristic for each of the non-linear resistance devices or diodes 3 and 3'. This curve illustrates the non-linear resistance characteristic of such diodes. With the diodes 3 and 3' poled as indicated in Fig. 4, it will be noted from Fig. 5 that when the resultant voltage across diode 3' is negative no current flows therethrough, while current does flow when this resultant voltage becomes positive. Since diode 3 is oppositely poled for the high frequency or RF, it may be deduced from Fig. 5 that when the resultant voltage across diode 3 is positive no current flows therethrough, while current does flow when this resultant voltage becomes negative.

Figure 6A:
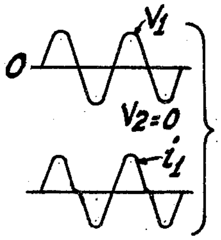

Figs. *6a*, *6b* and *6c* show the effects of the two applied voltages $V_1$ and $V_2$ on the circuit of Fig. 4, consideration being given to the characteristic of Fig. 5, which applies to each of the two diodes 3 and 3'. In Fig. 6*a* the D. C. voltage $V_2$ is assumed to be zero, the current $i_1$ through capacitor 4 being plotted below the applied voltage. Since the low frequency voltage $V_2$ passes through two diodes in series in Fig. 4, it must be doubled as compared with what it would need to be if only one diode were used. However, in Fig. 4 arrangement two equal and opposite current pulses occur for each cycle of RF voltage $V_1$, since diode 3 conducts for one half-cycle and diode 3' conducts for the opposite half-cycle. This is illustrated in Fig. 6*a*. The resistance to the high frequency alternating current is thus halved as compared to an arrangement using only one diode. Also, since two equal and opposite current pulses occur for each RF cycle, the even harmonics are eliminated from the current $i_1$.

Figure 6B:
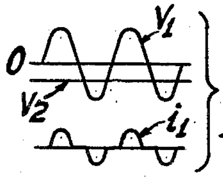

Fig. 6*b* shows the effect of applying a negative D. C. voltage $V_2$ to the Fig. 4 circuit. The diodes 3 and 3' are now in effect biased negatively, so that current can flow through each diode only for something less than a half-cycle of the RF voltage $V_1$. The pulses of current $i_1$ are therefore reduced in size, effectively increasing the resistance of the diodes to high frequency.

Figure 6C:
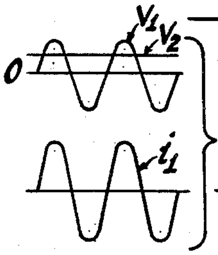

Fig. 6*c* shows the effect of applying a positive D. C. voltage $V_2$ to the Fig. 4 circuit. The diodes 3 and 3' are now in effect biased positively, so that current can flow through each diode for something more than a half-cycle of the RF voltage $V_1$. The pulses of current $i_1$ are therefore increased in size, effectively reducing or decreasing the resistance of the diodes to high frequency.

It may be seen that in the circuit of Fig. 4, varying the low frequency voltage $V_2$ varies the resistance of the diode arrangement to the high frequency or RF voltage $V_1$.

A double-diode arrangement can be used as a variable resistance (in accordance with the teachings of Fig. 4), this variable resistance being connected in series with a fixed reactance in order to provide a variable susceptance (in accordance with the teachings of Fig. 1), the variable susceptance circuit then being connected across a tuned frequency-determining circuit which controls an oscillator and the low frequency current through the diodes or the low frequency voltage applied to the diodes being controlled by connecting the diodes in the anode circuit of a multielectrode tube.

A variable frequency oscillator using the valuable (for oscillator frequency control) double-diode principle illustrated in Fig. 4 is shown in circuit form in Fig. 7. The evacuated tetrode electron discharge device 6 is connected in a well-known Hartley oscillator circuit, one end of the tuned circuit 7 being grounded and coupled to the anode 8 of tetrode 6 by means of a capacitor 9 connected between said anode and ground. The screen grid 21 of tube 6 is bypassed to ground by way of a capacitor 22 and is connected to the positive terminal of a source of unidirectional potential through a resistor 23. The ungrounded or high alternating potential end of circuit 7 is connected to the control grid 10 through a parallel RC arrangement consisting of a resistor 11 and a capacitor 12, while the tetrode filamentary cathode 13 is connected to an intermediate point on the inductance 24 of resonant circuit 7. Oscillations are developed in the tube 6 and its circuit in a well-known manner, and it is the frequency of these oscillations which is controlled by the circuit arrangement of Fig. 7.

The resonant circuit 7 of the oscillator consists of an inductance 24 and a variable capacitor 25 connected in parallel. The upper or ungrounded end of circuit 7 is coupled through a capacitor $C_1$ or 4 to a pair of oppositely-arranged non-linear resistances, such as diodes 3 and 3'. Diodes 3 and 3' are connected in series with capacitor 4 and in parallel for the high frequency or radio frequency energy by means of two capacitors 20 and 17, one of which is connected between each respective diode and ground, on the sides of the diodes opposite from capacitor 4. It will be remembered that the lower end of circuit 7 is grounded. Diode 3' is connected between capacitor 4 and the anode of a pentode evacuated electron discharge device structure 15 the filamentary cathode 16 of which is connected to ground. Diode 3 is connected between capacitor 4 and one end of a resistor 26 the other end of which is connected to the positive terminal of a source of unidirectional potential the negative terminal of which is grounded. In this way, the two diodes 3 and 3' are connected in series with each other and in series with the anode-cathode path of control tube 15 across the unidirectional potential source.

Capacitance 27 is the parasitic capacitance-to-ground which shunts the crystal diodes 3 and 3' due to their own capacitance, the wiring capacitance, and the holder capacitances. A part of this capacitance appears between the diode side of capacitor 4 and ground, another part appears directly across diode 3, and the remaining part directly across diode 3'. Insofar as operation is concerned, those parts of capacitance 27 which are directly across diodes 3 and 3' in Fig. 7 have the same effect as capacitor $C_2$ in Fig. 1, since in Fig. 7 the capacitors 20 and 17, respectively, effectively ground one side of each of said parts of capacitance 27, for radio frequencies.

The control grid 28 of tube 15 is grounded. The screen grid 29 of tube 15 is supplied with positive potential through the resistor 31, while the suppressor grid 30 of this tube is connected to cathode 16.

The screen grid 29 is used to control or vary the current passing through tube 15 and hence also the low frequency current through crystals 3 and 3' in the anode-cathode circuit of this tube. In practice, the potentials applied to grid 29 come from the anode of a direct-coupled amplifier tube stage (not shown). To the grid of this last-mentioned amplifier tube stage there may be supplied an automatic frequency control (AFC) voltage which may be derived from the output of a frequency discriminator or other frequency-responsive circuit which is, in turn, supplied with an input signal representative of the frequency of oscillator 6, if the latter is to be subjected to AFC. If desired, to the grid of the direct-coupled amplifier tube stage there may be supplied modulating voltages, such as might be representative of speech, telegraphic signals or any other suitable intelligence which may vary in amplitude, in frequency, or both. In this latter case, the oscillator 6 may be subjected to frequency modulation (FM).

The tube 15, the potentials applied to grid 29 of which are representative of modulating and/or frequency correcting signals, provides a variation of the low frequency current through crystals 3 and 3', which variation acts to vary their resistances (as explained previously in connection with Figs. 4 and 6) and this variation of total resistance in the circuit which is connected across tuned circuit 7 acts (by a variation of susceptance) to vary the high frequency generated by the oscillator including tube 6 (as explained previously in connection with Figs. 1–3). Thus, automatic frequency control and/or frequency modulation of the said oscillator can be effected.

The double-diode or double-crystal arrangement of Fig. 7 provides a two-fold advantage over an arrangement using only one diode. In the first place, the tube 15 has a limited current capacity, so that it is impossible to increase the current flowing through the diodes beyond a certain limit. However, by allowing the low frequency current to flow through two crystal diodes instead of only one, in effect twice as much use is made of this current, so that the RF resistance of the variable-resistance circuit, for the same electrode voltages on tube 15, is approximately halved, as compared with what it would be if only one diode were used. Since it is frequently difficult in such a variable-resistance circuit to obtain a sufficiently low value of this RF resistance (the high value, with no low frequency current, being much greater than necessary), this is a marked advantage. In the second place, the reduction of second harmonic (actually, all even harmonic) current, as described previously in connection with Figs. 4 and 6, moves the nearest extraneous frequency to the third harmonic, where the impedance of the tuned circuit 7 is lower and hence the amount of harmonic voltage generated is less. Where the oscillator drives successive amplifier stages, discrimination against this third harmonic frequency is easier than against the second harmonic. This second harmonic reduction action would be particularly advantageous when using a push-pull type of oscillator, which itself generates low even harmonics. For oscallators of the type illustrated, the oscillator-generated harmonics are believed to generally be considerably stronger than those caused by the modulator circuit. However, even in this case the elimination of even harmonics in the modulator circuit produces a more uniform loading effect (RF current being drawn once each half-cycle instead of once each cycle), which is advantageous.

The following component values for Fig. 7 are given by way of example. These were the values used in an arrangement according to this invention which was built and successfully tested.

| | |
|---|---|
| Tube **6** | Type 3B4. |
| Tube **15** | Type 5672. |
| Diode **3** | Type 1N35. |
| Diode **3′** | Type 1N35. |
| Capacitor **4** | 3 mmfd. |
| Capacitor **12** | 47 mmfd. |
| Capacitor **17** | 1,000 mmfd. |
| Capacitor **20** | 1,000 mmfd. |
| Capacitor **22** | 500 mmfd. |
| Capacitor **25** | 23–50 mmfd. |
| Capacitor **27** | 3.4 mmfd. |
| Resistor **11** | 18,000 ohms |
| Resistor **23** | 3,300 ohms. |
| Resistor **26** | 1,500 ohms. |
| Resistor **31** | 56,000 ohms. |
| Inductance **24** | 0.342 microhenry. |

With the constants listed above, it is possible to change the frequency of the oscillator in Fig. 7 plus or minus 400 kc. (kilocycles) when it is tuned to 55 mc. (megacycles), and plus or minus 115 kc. when it is tuned to 38 mc. Thus, it is seen that very large frequency deviations can be achieved with the arrangement of this invention. On the other hand, with only a single diode these frequency variations might be reduced to plus or minus 300 kc. and plus or minus 90 kc., respectively.

Diodes have been referred to hereinabove merely by way of example, as typical non-linear resistance devices, since diodes generally give better results than other types of non-linear resistance devices, in the circuit of this invention. However, various other types of non-linear resistance devices, such as the material known commercially as thyrite, will operate satisfactory in the circuit of this invention. Also, thermistors or varistors can be used. If diodes are used, they can be either crystal diodes or vacuum tube diodes. Both of these types of diodes are, in effect, rectifiers. The crystals used can be of the germanium type, the silicon type, or any other suitable type.

The use of a germanium crystal diode provides certain advantages over a vacuum tube diode, in that a wider range of resistance variation is obtainable from the former, and no heater power is required for the former. However, presently-available crystals which might be used in the circuit of the invention have poor temperature stability as compared to vacuum tube diodes, so that in this respect the use of vacuum tube diodes would be more advantageous than crystal diodes.

What is claimed is:

1. A frequency control circuit for an oscillator having a resonant tank circuit, comprising two non-linear resistance devices, a controllable electron discharge device having its anode-cathode path connected in series with said two devices across a source of potential, whereby a controllable flow of current through said two devices is established, a capacitor connected between one end of said tank circuit and the common junction point of said two devices, and connections of low impedance to oscillatory energy between the other ends of said two devices and the other end of said tank circuit.

2. A circuit in accordance with claim 1, wherein the two resistance devices are diode rectifiers.

3. A circuit in accordance with claim 1, wherein the two resistance devices are diode rectifiers and wherein the electron discharge device is a grid-controlled device to the grid of which a control voltage is applied.

4. A frequency control circuit for an oscillator having a resonant tank circuit, comprising a controllable electron discharge device having an anode circuit supplied from a source of current, two non-linear resistance devices connected in series in said anode circuit between said source and the discharge device anode, means for controlling the electron flow through said discharge device in response to a variable low frequency current, a reactive impedance connected between one end of said tank circuit and the common junction point of said two devices, and connections of low impedance to oscillatory energy between the other ends of said two devices and the other end of said tank circuit.

5. A controllable circuit in accordance with claim 4, wherein the two resistance devices are diode rectifiers.

6. A frequency modulation system comprising an oscillator having a circuit containing a reactance the variation of which varies the frequency of the oscillator, a modulating system connected across at least a portion of said circuit, said modulating system comprising a reactance element in series with two parallel paths each of which contains a rectifier the directions of conductivity of which are opposed to each other with reference to said oscillator circuit, one of said paths containing in series with its rectifier the space current path of an electron discharge device in parallel with a capacitor, and a source of modulating voltage connected to said device.

7. A system in accordance with claim 6, wherein said device has a control electrode therein, and wherein the source of modulating voltage is connected to said control electrode.

References Cited in the file of this patent

UNITED STATES PATENTS

| | | |
|---|---|---|
| 2,588,551 | McCoy | Mar. 11, 1952 |
| 2,610,318 | Clark | Sept. 9, 1952 |